United States Patent
Chen et al.

(10) Patent No.: US 9,685,874 B2
(45) Date of Patent: Jun. 20, 2017

(54) CIRCUIT AND METHOD FOR EVALUATION OVERLOAD CONDITION IN FLYBACK CONVERTER

(71) Applicant: Alpha and Omega Semiconductor (Cayman) Ltd., Sunnyvale, CA (US)

(72) Inventors: Yu-Ming Chen, Hsinchu (TW); Jung-Pei Cheng, Zhubei (TW); Pei-Lun Huang, Zhubei (TW)

(73) Assignee: Alpha & Omega Semiconductor (Cayman), Ltd., Sunnyvale, CA (US)

( * ) Notice: Subject to any disclaimer, the term of this patent is extended or adjusted under 35 U.S.C. 154(b) by 168 days.

(21) Appl. No.: 14/788,340

(22) Filed: Jun. 30, 2015

(65) Prior Publication Data

US 2016/0178671 A1    Jun. 23, 2016

(30) Foreign Application Priority Data

Dec. 17, 2014   (CN) .......................... 2014 1 0791004

(51) Int. Cl.
*G01R 31/02* (2006.01)
*H02M 3/335* (2006.01)
(Continued)

(52) U.S. Cl.
CPC ......... *H02M 3/33507* (2013.01); *H02M 1/32* (2013.01); *G01R 19/16538* (2013.01); *G01R 31/40* (2013.01); *H02M 2001/0009* (2013.01)

(58) Field of Classification Search
CPC ...... G01R 31/002; G01R 31/00; G01N 27/42; G01N 31/02
(Continued)

(56) References Cited

U.S. PATENT DOCUMENTS 6,862,194 B2   3/2005  Yang et al.
6,940,320 B2   9/2005  Sukup et al.
(Continued)

FOREIGN PATENT DOCUMENTS

CN    201450456 U    5/2010
CN    103986336 A    8/2014
(Continued)

*Primary Examiner* — Jermele M Hollington
*Assistant Examiner* — Raul Rios Russo
(74) *Attorney, Agent, or Firm* — Lance A. Li; Chein-Hwa Tsao

(57) ABSTRACT

A circuit and a method for evaluating a load condition in a flyback converter are disclosed. A first current source is used for providing a preset current $I_{SUM}$ equal to a sum of the off current value $I_{OFF}$ and the blanking current value $I_{LEB}$ to charge a first capacitor, and a second current source is used for providing a reference current $I_{REF}$ to charge a second capacitor. A comparator receives a voltage applied on the first capacitor at its positive input end and a voltage applied on the second capacitor at its negative input end. The output current transmitted to the load by the flyback converter is varied to the change of the preset current $I_{SUM}$, as such the load condition is detected by the comparison result generated by the comparator.

22 Claims, 11 Drawing Sheets

(51) Int. Cl.
 *H02M 1/32* (2007.01)
 *H02M 1/00* (2006.01)
 *G01R 31/40* (2014.01)
 *G01R 19/165* (2006.01)

(58) Field of Classification Search
 USPC ......... 324/71, 378, 403, 415, 425, 500, 537;
 363/21.01, 21.12, 95, 97
 See application file for complete search history.

(56) References Cited

U.S. PATENT DOCUMENTS

| | | |
|---|---|---|
| 7,265,999 B2 | 9/2007 | Murata et al. |
| 8,213,192 B2 | 7/2012 | Konecny et al. |
| 8,508,960 B2 | 8/2013 | Chen et al. |
| 2004/0155639 A1 | 8/2004 | Mobers |
| 2005/0270807 A1* | 12/2005 | Strijker ............. H02M 3/33507 363/21.01 |
| 2009/0040796 A1 | 2/2009 | Lalithambika et al. |
| 2009/0141523 A1 | 6/2009 | Sugawara |
| 2009/0147548 A1* | 6/2009 | Chang ............... H02M 3/33507 363/21.18 |
| 2011/0069420 A1 | 3/2011 | Chiu et al. |
| 2011/0216559 A1 | 9/2011 | Ng et al. |
| 2012/0274299 A1 | 11/2012 | Chang et al. |
| 2013/0057323 A1 | 3/2013 | Spini et al. |
| 2013/0223108 A1 | 8/2013 | Xu |

FOREIGN PATENT DOCUMENTS

| | | |
|---|---|---|
| CN | 203840204 U | 9/2014 |
| TW | I437238 B | 5/2014 |

\* cited by examiner

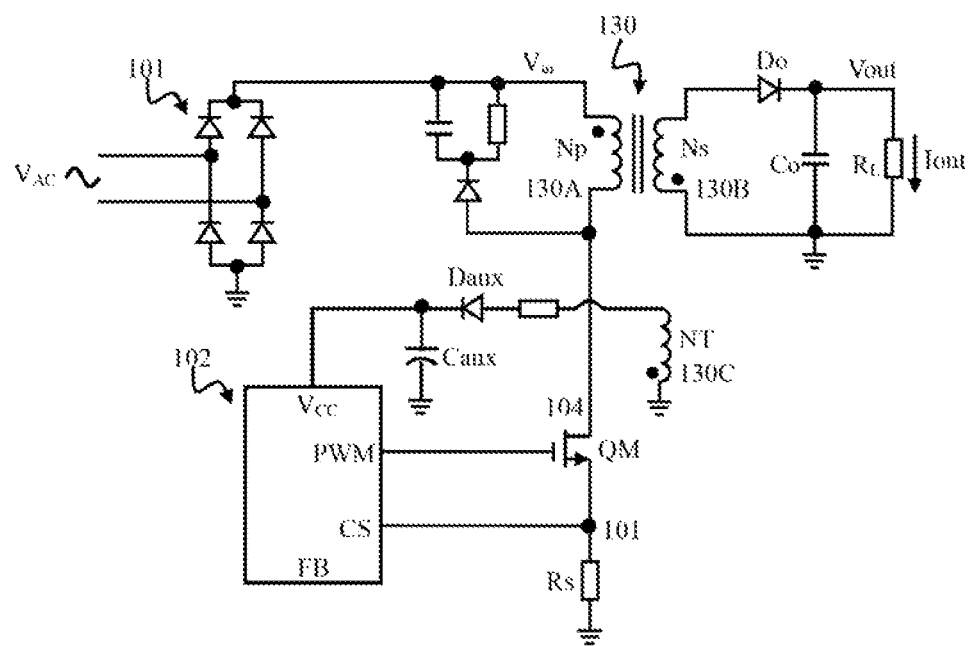
FIG. 1
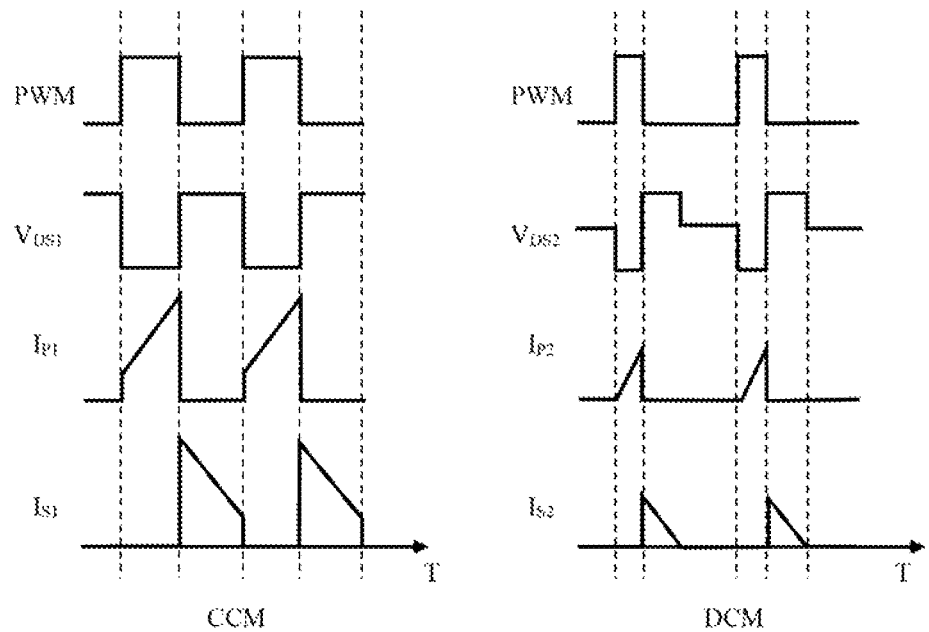
FIG. 2A
FIG. 2B

US 9,685,874 B2

CIRCUIT AND METHOD FOR EVALUATION OVERLOAD CONDITION IN FLYBACK CONVERTER

CROSS-REFERENCE TO RELATED APPLICATIONS

This application claims the priority benefit of a Chinese patent application number 201410791004.6 filed Dec. 17, 2014 by a common inventor of this Application. The entire Disclosure made in the Chinese patent application number 201410791004.6 is hereby incorporated by reference.

TECHNICAL FIELD

The present invention relates to a power conversion system, and in particular, to the detection and evaluation of the output current in a voltage flyback converter applied in a power supply to decide whether the converter accesses into an overload condition.

BACKGROUND ART

Conventional power conversion systems generally use a power switching in constant voltage or a constant current mode. In a power conversion system, switch element on the primary winding of a transformer is turned on or off periodically producing a current flowing through the primary winding of the transformer, thus the energy at the primary side is transferred to the secondary side, and the AC current generated on a secondary winding is rectified and filtered while passing through an injection diode and a capacitor and converted into a direct current supplied to the load. However, the prior art is facing a problem in accurate evaluation of the output current provided to the load, especially in a Continuous Conduction Mode (CCM) and a Discontinuous Conduction Mode (DCM). Furthermore, the prior art is facing a problem in setting an output current basis to decide whether a flyback voltage converter accesses into an overload condition.

BRIEF DESCRIPTION OF THE DRAWINGS

The embodiments of this invention are described in more detail with reference to the accompanying drawings. However, the accompanying drawings are for the purpose of descriptions and illustrations only and do not impose limitation to the scope of the present invention:

FIG. 1 shows a simplified circuit drawing of a flyback converter of the present invention.

FIG. 2A shows waveform of a primary current and waveform of a secondary current controlled by a main switch driven by a control signal while in CCM.

FIG. 2B shows the waveform of the primary current and waveform of the secondary current controlled by the main switch driven by a control signal in DCM.

FIG. 3 shows the waveform of a leading edge blanking signal LEB used for shielding the initial spike of the leading edge of a sensing signal at the moment the main switch is driven to turn on.

DETAILED DESCRIPTION OF PREFERRED EMBODIMENTS

Figure 3:
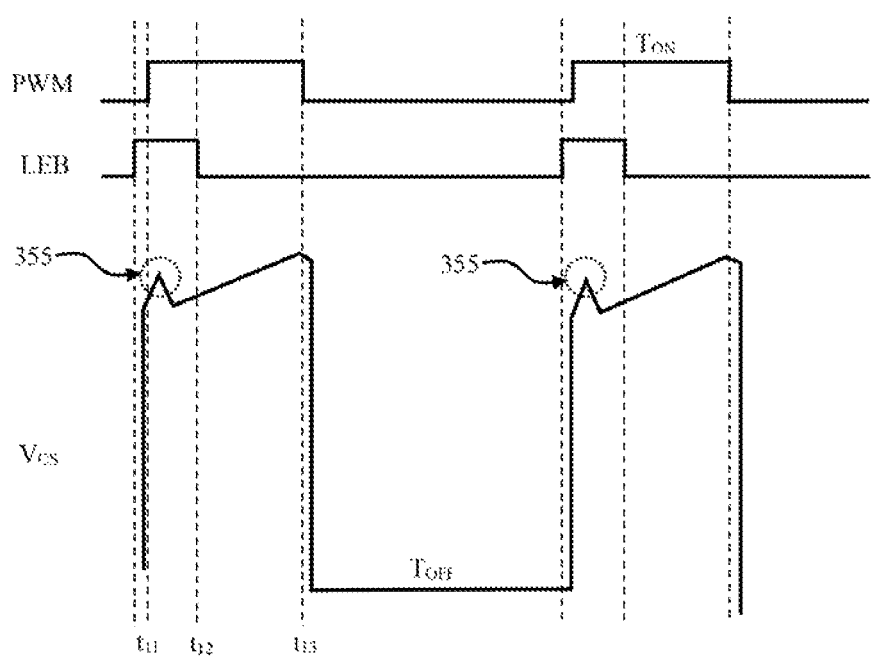

FIG. 1 shows a circuit diagram of a flyback voltage converter of the present invention, which includes a main switch QM at the primary side, such as a power Metal-Oxide-Semiconductor Field Effect Transistor (MOSFET), having a drain as an input terminal, a source as an output terminal, and a gate as a control terminal. The main switch QM receives a control signal sent by a main control module 102 at its control terminal and correspondingly turns on or off thus controlling the current flowing through a primary winding 130A of a transformer 130 of the flyback converter to transmit the energy at the primary side to the secondary side. The primary winding 130A receives a DC input voltage $V_{IN}$, which can be obtained by the rectification of a supply AC voltage $V_{AC}$ through a bridge rectifier and other rectifying elements. The transformer 130 also includes a secondary winding 130B for delivering an output voltage $V_{OUT}$ and an auxiliary winding 130C for detecting a voltage condition produced on the secondary winding 130B. The polarity of the auxiliary winding 130C and that of the secondary winding 130B are the same but are opposite to that of the primary winding 130A. One end of the auxiliary winding 130C is grounded and the other end is connected to the anode of a diode $D_{AUX}$, while the cathode of the diode $D_{AUX}$ is connected to a capacitor $C_{AUX}$, so that the AC voltage produced on the auxiliary winding 130C is rectified to charge the capacitor $C_{AUX}$ as an auxiliary power supply, so that a voltage $V_{CC}$ stored on the capacitor $C_{AUX}$ is related to and is proportional with the output voltage $V_{OUT}$, and the voltage $V_{CC}$ can separately provide a DC voltage source for the main control module 102. The secondary winding 130B is connected with a diode $D_O$ and a capacitor for $C_O$ of a rectifier—filter circuit for producing the output voltage $V_{OUT}$ of the flyback converter. The DC output voltage $V_{OUT}$ is applied on a load $R_L$ and thus generates an output current $I_{OUT}$ flowing through the load $R_L$. In a feedback loop of the converter, a sensing resistor $R_S$ is connected between the source of the main switch QM and the ground. The sensing resistor $R_S$ is used for sensing and detecting a primary current $I_P$ flowing through the primary winding 130A and providing a feedback voltage that equals a product of the primary current $I_P$ and the resistance of the inductive resistor $R_S$, i.e., a voltage sensing signal $V_{CS}$. The primary current $I_P$ can be used for representing a secondary current $I_S$ flowing through the secondary winding 130B, and the functional relationship between the primary current $I_P$ and secondary current $I_S$ will be described in detail later. A sensing port CS of the main control module 102 detects the primary current $I_P$ of the primary winding 130A using the sensing resistor $R_S$ in real time as a basis to decide whether it is necessary to adjust the control signal to control the on/off state of the main switch QM. The topology and operation mode of the flyback converter are well known in the art, thus the circuit diagram and the specific operation mode will not be described here.

As shown in FIG. 2A, in the continuous conduction mode (CCM), the main switch QM is driven to turn on/off by a control signal such as a pulse width modulation (PWM) signal and likes. In FIG. 2A, the waveform of a primary current $I_{P1}$ flowing through the primary winding 130A, the waveform of a secondary current $I_{S1}$ flowing through the secondary winding 130B, and the waveform of a differential voltage $V_{DS1}$ between the drain and the source of the main switch QM are shown. At the initial stage of the on time period $T_{ON}$ of the main switch QM, the primary current $I_{P1}$ has a step leading edge and begins to increase linearly from the leading edge, and at the off period $T_{OFF}$ of the main switch QM, the secondary current $I_{S1}$ is an attenuating triangular wave. Thus in the following cycle at the instance when the main switch QM is about to turn on, there is still current remain in the secondary winding 130B, i.e. in the following cycle when the main switch QM turns on, the energy stored in the transformer 130 is not completely drained.

FIG. 2B shows the waveform of a primary current $I_{P2}$ flowing through the primary winding 130A, the waveform of a secondary current $I_{S2}$ flowing through the secondary winding 130B, and the waveform of a differential voltage $V_{DS2}$ between the drain and the source of the main switch QM in the discontinuous condition mode (DCM) of the converter. As shown in this figure under the DCM, the primary current $I_{P2}$ does not have a step leading edge, and the secondary current $I_{S2}$ is a direct attenuating triangular wave during the off time $T_{OFF}$ of the main switch QM, which is attenuated to zero at the end of the $T_{OFF}$ before the start of the next cycle, and the energy of the main switch QM stored in the primary winding 130A during the on period has been completely transferred to the load by the secondary winding 130B before the start of the next cycle. A difference between the DCM and the CCM in any cycle is that the secondary current $I_{S2}$ will reduce to zero when the control signal turns off the main switch QM, and a period of dwell-time $T_D$ will exist between the time when the primary current $I_{S2}$ reduces to zero and the start of the next cycle (i.e., the moment the main switch QM is turned on again).

As shown in FIG. 3, a leading edge blanking signal LEB, which is well known in the art, is implemented to prevent unnecessary incorrect trigger during the detection of the primary current $I_P$ since the primary current $I_P$ often has a initial pulse peak at the instance the main switch QM in the primary current loop. The initial spike will be fed back to the main control module 102 at the sensing port CS, and if the sensing resistor $R_S$ connected in series with the primary winding captures the current value and uses it as the sensing signal $V_{CS}$ to control the on/off state of the power switch, causing a false trigger action due to an unexpected initial spike 355 of the sensing signal $V_{CS}$ in FIG. 3 thus further initiating an over-current protection system, so that the main control module 102 will not send the PWM signal and erroneously turning off the power main switch QM to protect the power switch and/or the entire flyback converter even though there is no actual over-current condition. A variable or fixed leading edge blanking signal LEB generated by the conventional leading edge blanking circuit is used for eliminating such risks of false trigger, and the signal can be coupled to the control terminal of the main switch QM to ensure the main switch QM is not erroneously turned off during the period in which the leading edge blanking signal LEB is at high level, and the current signal is sampled on the sensing resistor $R_S$ after the leading edge blanking signal LEB is ended to capture a true and precise initial value of the sensing signal $V_{CS}$, and thereby shielding the initial pulse peak of the primary current $I_P$ at the moment the main switch QM is turned on. The conventional power design instruction manuals disclose the design of a leading edge blanking circuit, and for more detailed description, U.S. Pat. Nos. 8,278,830 and 8,300,431 and other literature can also used as references.

Figures 4A, 4B, 4C:
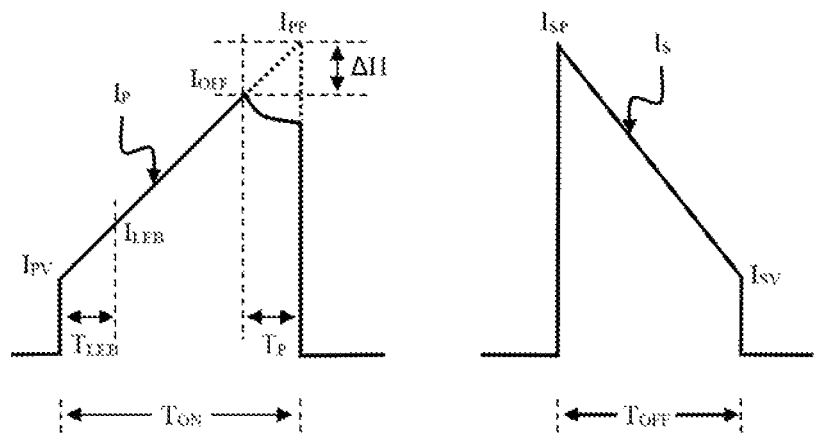
FIG. 4A to FIG. 4C show the stepped current waveforms of the primary current and the secondary current in the CCM.

Referring to FIG. 4A to FIG. 4C, when the flyback converter enters into the CCM, the control signal will drive the main switch QM to turn on at the initial time $t_{11}$ of a cycle. Due to the remaining energy in the transformer 130, the primary current $I_P$ quickly jumps from zero to an initial leading edge value $I_{PV}$ at the moment the main switch QM is turned on, which is an initial step leading edge value greater than zero. In the following period from $t_{11}$ to $t_{13}$, as the control signal continues to drive the main switch QM to be on, the primary current $I_P$ continues to gradually increase at a linear rate from the leading edge initial value $I_{PV}$. It should be noted that at the time $t_{13}$, the control signal changes from a high level to a low level and intends to turn off the main switch QM, however the primary current does not drop immediately, but during the period of the delay time $T_P$ from $t_{13}$ to $t_{14}$, the primary current $I_P$ rises to the maximum peak current $I_{PP}$ at the same rate as that in the period from $t_{11}$ to $t_{13}$, and quickly drops from the peak value $I_{PP}$ to zero at the time $t_{14}$ at the end of the delay time $T_P$. As shown in FIG. 4B to FIG. 4C, in the period from $t_{14}$ to $t_{15}$, the control signal drives the main switch QM to turn off completely, and the stored energy in the primary winding 130A of the transformer 130 begins to be transmitted to the secondary winding 130B at time $t_{14}$, while the secondary current $I_S$ flowing through the secondary winding 130B jumps from zero to the maximum current peak value $I_{SP}$ at the time $t_{14}$, at this time, the polarity of the winding on the transformer 130 with the same marking is opposite with that of the different marking, so that the flyback voltage of the secondary winding 130B enables the rectifier diode $D_O$ in FIG. 1 to be forward bias to charge the output capacitor $C_O$ and to provide the load current, and the secondary current is gradually decreases at a constant rate in the period of time from $t_{14}$ to $t_{15}$. The cycle is ended at time $t_{15}$, and the main switch QM is turned on again in the following cycle, but at this time the secondary current $I_S$ has an end state trailing edge final value $I_{SV}$, which is an end state step value greater than zero. After time $t_{15}$, the main switch QM is turned on again in the following cycle, and the secondary current $I_S$ drops from the end state trailing edge final value $I_{SV}$ to zero. For the CCM operation, the period from time $t_{11}$ to time $t_{15}$ can be viewed as a complete cycle $T_S$, in which the period from time $t_{11}$ to time $t_{14}$ can be defined as the on-period $T_{ON}$ during which the main switch QM is turned on, the period from time $t_{14}$ to time $t_{15}$ can be defined as the off-period $T_{OFF}$ in which the main switch QM is turned off, the duty ratio $D_{B1}$ of the switch should be $T_{ON}$ dividing the sum $(T_{ON}+T_{OFF})$ of the on-period and the off-period, i.e., $D_{B1}=T_{ON}/(T_{ON}+T_{OFF})$.

The ratio of the number of turns $N_P$ of the primary winding 130A and the number of turns $N_S$ of the secondary winding 130B is set as N, where the peak current $I_{SP}$ of the secondary current $I_S$ at the secondary winding is equal to $N \times I_{PP}$, and the end state trailing edge value $I_{SV}$ of the secondary current $I_S$ at the secondary winding is equal to $N \times I_{PV}$. In the CCM of the flyback converter, the output current $I_O$ provided to the load $R_L$ meets the following function relationship:

$$I_O = \frac{I_{SP} + I_{SF}}{2} \times \frac{T_{OFF}}{T_S} \quad (1)$$

$$I_O = \frac{N \times (I_{PP} + I_{PV})}{2} \times (1 - D_{B1}) \quad (2)$$

Referring to FIG. 4A and FIG. 4C, at the time $t_{13}$, the logic state of the control signal is intentionally changed from high level to low level thus driving the main switch QM to turn off, causing the primary current $I_P$ having an off current value $I_{OFF}$, which is a transient value. As mentioned above, in the period of delay time $T_P$ from time $t_{13}$ to time $t_{14}$, the off current value $I_{OFF}$ is not the maximum value of the primary current $I_P$, the primary current does not drop immediately even though the control signal has been changed from high level to low level at the time $t_{13}$ thus turning off the main switch QM, but in fact, in the period from $t_{13}$ to $t_{14}$, the primary current $I_P$ continues to increase from the off current value $I_{OFF}$, with a rate same as that of the period from the initial leading edge value $I_{PV}$ to the off current value $I_{OFF}$, until the current $I_P$ reaches to the maximum value of the peak current $I_{PP}$ as shown in the peak of a dotted line in FIG. 4A. After the delay time $T_P$ is ended and the off-period $T_{OFF}$ starts, the main switch QM is turned off, the primary current $I_P$ quickly drops to zero from the peak current $I_{PP}$ at the time $t_{14}$.

Referring to FIG. 3, at the time $t_{12}$ the leading edge blanking signal LEB is changed from the high level to the low level ending its active state, a current value of the primary current $I_P$ is sampled as a blanking current value $I_{LEB}$, which is an intermediate current value, and the primary current $I_P$ increases from the initial leading edge value $I_{PV}$ (leading edge step value) to the blanking current value $I_{LEB}$ initial with a rate of increment is totally the same as that of the primary current $I_P$ rises from the off current value $I_{OFF}$ to the peak current $I_{PP}$. In a complete cycle, the length of time $T_{LEB}$ between the time $t_{11}$ when the control signal drives the main switch QM on to the time $t_{12}$ when the leading edge blanking signal LEB is ended is equal to the delay time $T_P$ between the time $t_{13}$ when the control signal drives the main switch QM to turn off and the time $t_{14}$ when the primary current $I_P$ rises to the peak current $I_{PP}$, i.e., $T_{LEB} = T_P$. In addition, as shown in FIG. 4A, a current difference value $\Delta I1$ between the peak current value $I_{PP}$ and the off current value $I_{OFF}$ is further defined, as such the current relationship can be calculated from geometric perspective of FIG. 4A as $I_{PP} = I_{OFF} + \Delta I1$ and $I_{PV} = I_{LEB} - \Delta I1$, then:

$$I_{PP} + I_{PV} = (I_{OFF} + \Delta I1) + (I_{LEB} - \Delta I1) \quad (3)$$

$$I_{PP} + I_{PV} = I_{OFF} + I_{LEB} \quad (4)$$

Substituting equation (4) into the equation (2), the output current $I_O$ in the CCM can be obtained:

$$I_O = \frac{N \times (I_{OFF} + I_{LEB})}{2} \times \frac{T_{OFF}}{T_S} \quad (5)$$

where $T_S = T_{ON} + T_{OFF}$

Neither $I_{PP}$ nor $I_{SV}$ is included in the expression of the secondary side output current $I_O$ shown in equation (5). Because the degree of overshoot and the overshoot peak value are difficult to detect and measure by the circuit in reality, thus it is almost impossible to rely on $I_{PP}$ or $I_{SV}$ for the calculation of the output current $I_O$ and equation (5) is a good solution to this problem in CCM.

Figures 5A, 5B:
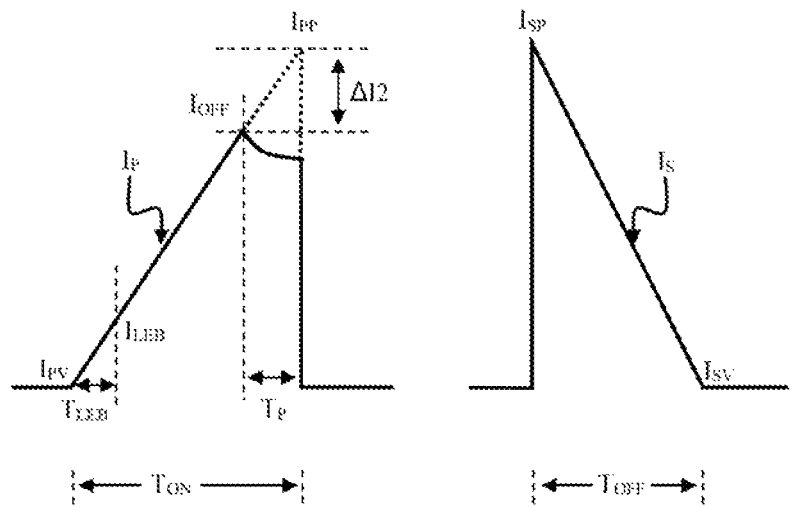
FIG. 5A to FIG. 5C show the triangular current waveforms of the primary current and the 15 secondary current in the DCM.
Figure 5C:
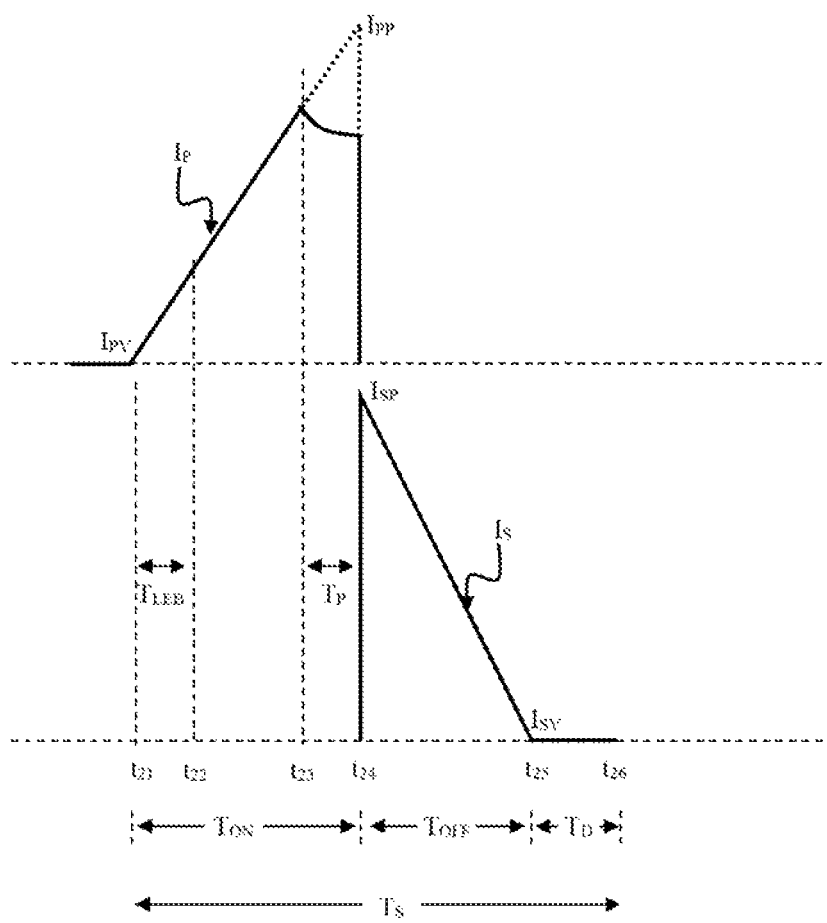

Referring to FIG. 5A to FIG. 5C, when the flyback converter enters into the DCM, the control signal drives the main switch QM to turn on at the starting time $t_{21}$ of one cycle. Since there is no remaining energy in the transformer 130 from the previous cycle, the initial leading edge value $I_{PV}$ of the primary current is almost zero at the moment the main switch QM is turned on, which is completely different from the initial step value greater than zero in the CCM. In the period from $t_{21}$ to $t_{23}$, as the control signal continues to drive the main switch QM turning on, the primary current $I_P$ gradually rises up in the constant rate from the initial leading edge value $I_{PV}$ of zero. At time $t_{23}$, the control signal changes form the logic high level to the logic low level thus turning off the main switch QM, and similarly as mentioned above in the CCM the primary current does not drop down immediately, and instead in the period of the delay time $T_P$ from $t_{23}$ to $t_{24}$, the primary current $I_P$ rises to the maximum peak current $I_{PP}$ at the same rate of the period from $t_2$, to $t_{23}$, and then quickly drops to zero from the peak value $I_{PP}$ at the time $t_{24}$ when the delay time $T_P$ is ended.

Referring to FIG. 5B and FIG. 5C, after the delay time $T_P$ is ended and in the period from $t_{24}$ to $t_{25}$, the control signal drives the main switch QM to turn off completely, and at the time $t_{24}$ the primary winding 130A of the transformer 130 starts to transfer the stored energy to the secondary winding 130B, thus the secondary current $I_S$ flowing through the secondary winding 130B jumps from zero to the maximum current peak value $I_{SP}$ at the time $t_{24}$, and the polarity of similarly marked end and that of the differently marked end of the windings of the transformer 130 are opposite, so that the flyback voltage of the secondary winding 130B enables the rectifier diode Do in FIG. 1 to be forward bias to charge the output capacitor $C_O$ and to provide the load current, and then the secondary current gradually decrease to zero at a constant rate in the period from $t_{24}$ to $t_{25}$. Another difference between the DCM and the CCM is that when the cycle is not ended, at the time $t_{25}$, the secondary current $I_S$ has an end trailing edge value $I_{SV}$ of zero, in other words, the secondary current $I_S$ has decreased to zero at the end of the off-period $T_{OFF}$ before the start of the next cycle, and the energy stored in the primary winding 130A during the on-period of the main switch QM has been completely transferred to the load by the secondary winding 130B before the start of the next cycle. In FIG. 5C, the secondary current $I_S$ drops to zero at the end of the off-period $T_{OFF}$ when the control signal turns off the main switch QM. A period of dwell-time $T_D$ exists between the time $t_{25}$ when the secondary current $I_S$ reduces to zero and the time $t_{26}$ when the current cycle ended. The next cycle starts after time $t_{26}$, so the dwell-time $T_D$ is between the time $t_{25}$ when the secondary current $I_S$ reduces to zero and the time the main switch QM is turned on again in the next cycle. Specifically for the flyback converter in the DCM, the time $t_{21}$ to time $t_{26}$ can be viewed as a complete cycle $T_S$, which includes a period from the time $t_{21}$ to time $t_{24}$ defined as the on-period $T_{ON}$ in which the main switch QM is turned on, a period from the time $t_{24}$ to time $t_{25}$ defined as the off-period $T_{OFF}$ in which the main switch QM is turned off, and a period from the time $t_{25}$ to time $t_{26}$ viewed as the dwell-time $T_D$ in which the main switch QM is also turned off, as such the duty ratio $D_{B2}$ of the switch at the primary side should be $T_{ON}$ dividing the sum of the on-period $T_{ON}$, the off-period $T_{OFF}$ and the dwell-time $T_D$, or $D_{B2}=T_{ON}/(T_{ON}+T_{OFF}+T_D)$.

The ratio of the number of turns $N_P$ of the primary winding 130A and the number of turns $N_S$ of the secondary winding 130B is set as N, where the peak current $I_{SP}$ of the secondary current $I_S$ at the secondary winding is equal to $N \times I_{PP}$, and the end trailing edge value $I_{SV}$ of the secondary current $I_S$ at the secondary winding is equal to zero. In the DCM of the flyback converter, the output current $I_O$ provided to the load $R_L$ meets the following function relationship:

$$I_O = \frac{I_{SP} + I_{SV}}{2} \times \frac{T_{OFF}}{T_S} \qquad (6)$$

$$I_O = \frac{N \times (I_{PP} + I_{PV})}{2} \times \frac{T_{OFF}}{T_S} \qquad (7)$$

As shown in FIG. 5A and FIG. 5C, at time $t_{23}$, the control signal changes from logic high level to logic low level driving the main switch QM to turn off causing the primary current $I_P$ having the off current value $I_{OFF}$ at the moment the control signal changing its logical state. In the period of the delay time $T_P$ from time $t_{23}$ to time $t_{24}$, the off current value $I_{OFF}$ does not reach the maximum value $I_{PP}$ of the primary current $I_P$, and even at time $t_{13}$ when the logical state of the control signal tends to turn off the main switch QM, the primary current $I_P$ does not drop immediately, but in fact, in the period from $t_{23}$ to $t_{24}$, the primary current $I_P$ continues to rise up from the off current value $I_{OFF}$, with the rate same as that when it rises from the initial leading edge value $I_{PV}$ to the off current value $I_{OFF}$, until the current $I_P$ reaching the maximum value of the peak current $I_{PP}$, as shown by the vertex of a dotted line in FIG. 5A. Once the delay time $T_P$ is ended and the off-period $T_{OFF}$ starts at time $t_{24}$, the main switch QM is completely turned off, the primary current $I_P$ really begins to quickly reduce to zero from the peak current $I_{PP}$.

Referring to FIG. 5C, at time $t_{22}$ when the leading edge blanking signal LEB changes from high level to low level ending its active state, a transient intermediate current value of the primary current $I_P$ is sampled as the blanking current value $I_{LEB}$, where the rate of increment when the primary current $I_P$ rises from the initial leading edge value $I_{PV}$ (zero value) to the blanking current value $I_{LEB}$ is totally the same as that when the primary current $I_P$ rises from the off current value $I_{OFF}$ to the peak current $I_{PP}$. In a complete cycle, the period between the time $t_{21}$ when the control signal drives the main switch QM to turn on to the time $t_{22}$ when the blanking signal LEB is ended is defined $T_{LEB}$ equal to the delay time $T_P$, which is the period between the time $t_{23}$ when the control signal drives to turn off the main switch QM and the time $t_{24}$ when the primary current $I_P$ rises to the peak $I_{PP}$, i.e., $T_{LEB}=T_P$; furthermore, a difference value $\Delta I2$ between the peak current $I_{PP}$ and the off current value $I_{OFF}$ is further defined, and the current relationship can be calculated with the geometric perspective of FIG. 5A, and thus $I_{PP}=I_{OFF}+\Delta I2$ and $I_{PV}=I_{LEB}-\Delta I2$ can be further obtained.

$$I_{PP}+I_{PV}=(I_{OFF}+\Delta I2)+(I_{LEB}-\Delta I2) \qquad (8)$$

$$I_{PP}+I_{PV}=I_{OFF}+I_{LEB} \qquad (9)$$

If equation (9) is substituted into equation (7), the final expression of the output current $I_O$ in the DCM can be obtained, wherein the cycle $T_S$ equals to $T_{ON}+T_{OFF}+T_D$:

$$I_O = \frac{N \times (I_{OFF} + I_{LEB})}{2} \times \frac{T_{OFF}}{T_S} \qquad (10)$$

Although the overshoot degree of the primary peak current $I_{PP}$ or the secondary end trailing edge current $I_{SV}$ are difficult to capture or detect, the equation (10) provides a good solution to this problem in the DCM, as the formula for calculating the output current $I_O$ does not contain the current value $I_{PP}$ or $I_{SV}$.

With the cycle $T_S$ defined differently above in the CCM and the DCM, the formula (5) and the formula (10) can be expressed as:

$$\frac{I_O}{N} = \frac{I_{OFF} + I_{LEB}}{2} \times \frac{T_{OFF}}{T_S} \qquad (11)$$

$$\frac{I_O}{N} = I_{SUM} \times \frac{T_{OFF}}{T_S} \qquad (12)$$

To decide whether the output current $I_O$ in the formula (5) and the formula (10) exceed a preset output current value due to overloading, $(I_{SUM} \times T_{OFF})/T_S$ needs to be evaluated to conform the formula (12), where the preset current $I_{SUM}$ equals to $(I_{LEB}+I_{OFF})/2$. According to the formula (12), the calculation of the output current value $I_O$ only needs to capture the average current $I_{SUM}$ and the off-period $T_{OFF}$ of a complete cycle $T_S$, so as the product of the average current $I_{SUM}$ multiplying with $(T_{OFF}/T_S)$ is completely calculated. FIG. 6A to FIG. 6D show the conventional calculation circuits for calculating the average current $I_{SUM}$, in which the voltage converted from the $I_{SUM}$ is compared with a reference value to determine whether the $I_{SUM}$ meets the requirements.

Figure 6A:
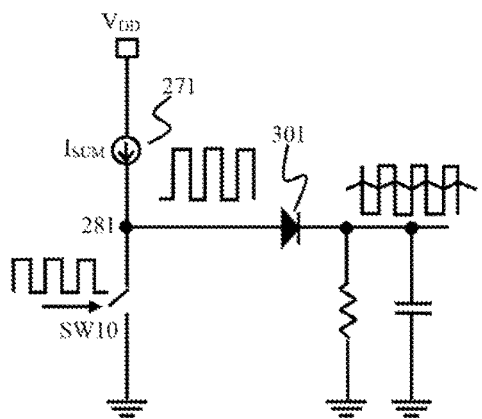
FIG. 6A to FIG. 6D show a conventional calculation circuit for calculating the average output current.

As shown in FIG. 6A, the circuit for calculating the average current $I_{SUM}$ includes a current source 271 supplying a current with the current value of $I_{SUM}$ and a switch SW10 connected between the current source 271 and the ground, only turned off during off-period $T_{OFF}$ of each cycle $T_S$ but turned on in the remaining time, so that the current source 271 provides a forward bias current through a diode 301, which includes the anode connected to a common node 281 between the current source 271 and the switch SW10, in the off-period $T_{OFF}$ but releases to the ground through the switch SW10 in the remaining time of the cycle $T_S$, as such the average current of $I_{SUM} \times (T_{OFF}/T_S)$ is obtained at the cathode of the diode 301. The circuit shown in FIG. 6B is basically the same as that in FIG. 6A, which includes a voltage V1 controlled by a switch SW11 and the diode 301 generating a current equivalent to the $I_{SUM}$, where the switch SW11 controls the current generated through the diode 301 in only off-period $T_{OFF}$ of a cycle.

Figure 6B:
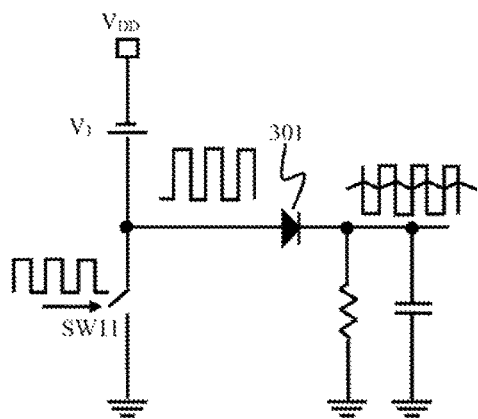
Figure 6C:
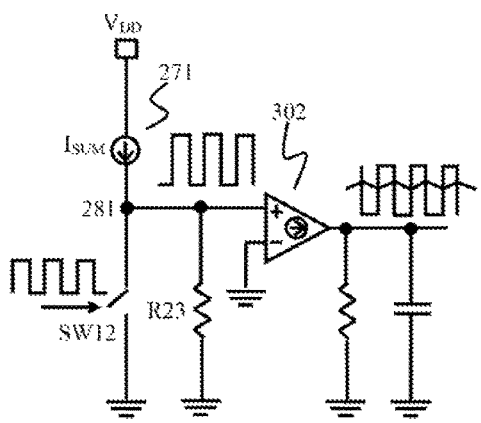

The circuit shown in FIG. 6C is basically the same as that in FIG. 6A excepting that a transconductance amplifier 302 is replaced for the diode 301 in FIG. 6A. A switch SW12 is only turned off in the off-period $T_{OFF}$ in each cycle $T_s$ and is turned on in the remaining time, so that the current $I_{SUM}$ supplied by the current source 271 flows to a resistor R23 in the time $T_{OFF}$, where one end of the resistor R23 is connected to the node 281 and also to the positive input end of the transconductance amplifier 302 and the negative input end of the transconductance amplifier 302 is connected to the grounded, thereby generating the average current of $I_{SUM} \times T_{OFF}/T_S$ at the output end of the transconductance amplifier 302.

Figure 6D:
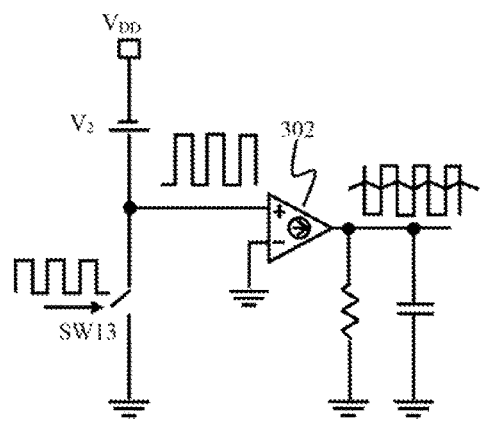

The circuit shown in FIG. 6D is basically the same as that in FIG. 6B excepting that the transconductance amplifier 302 is replaced for the diode 301 in FIG. 6B. A switch SW13 is only turned off in the off-period $T_{OFF}$ in each cycle Ts and is turned on in the remaining time, so that a voltage V2 is supplied to the positive input end of the transconductance amplifier 302 during the off-period $T_{OFF}$ and the average current of $I_{SUM} \times T_{OFF}/T_S$ is obtained at the output end of the transconductance amplifier 302.

Figure 7:
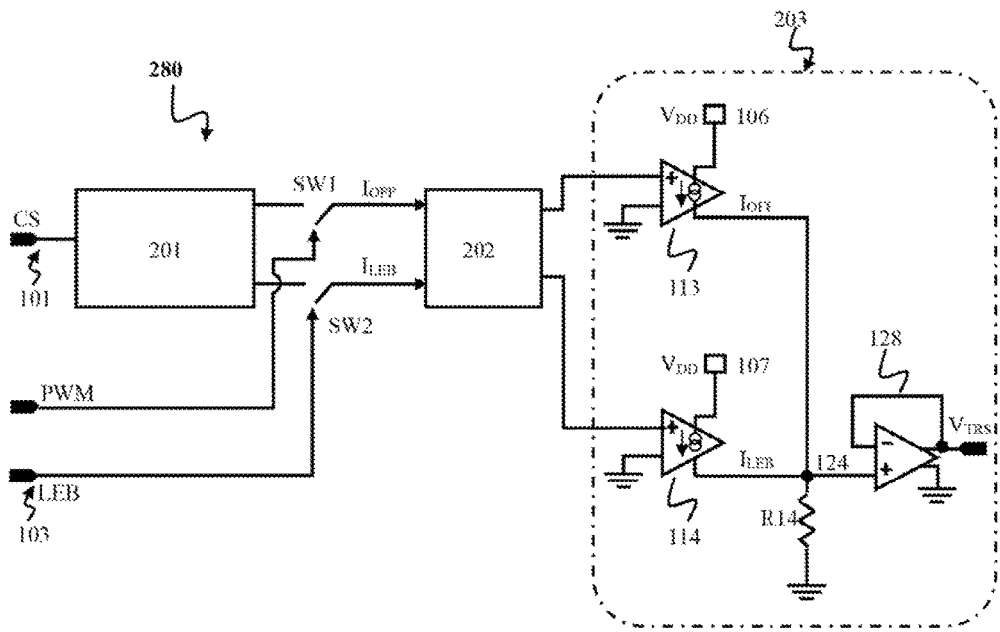
FIG. 7 shows a calculation circuit for detecting and summing an off current value and a blanking current value.

FIG. 7 shows a calculation circuit for calculating the average current of the present invention. As shown in this figure, a calculation circuit 280 is used for calculating the output current transmitting to the load by the secondary winding 130B in a flyback converter. The calculating circuit 280 includes a detection module 201 for detecting and capturing the primary current $I_P$ flowing through the primary winding 130A in a form of the sensing signal $V_{CS}$ crossing the sensing resistor $R_S$ since the primary current flowing through the sensing resistor $R_S$ at a certain time multiples with the resistance value of the sensing resistor $R_S$ resulting into the corresponding sensing signal $V_{CS}$. Detection module 201 is also used as a current detector to selectively detect the precise values of the blanking current value $I_{LEB}$ and the off current value $I_{OFF}$ at the appropriate time. A circuit diagram of the detection module 201 of the circulating circuit 280 is shown in FIG. 13.

Figure 13:
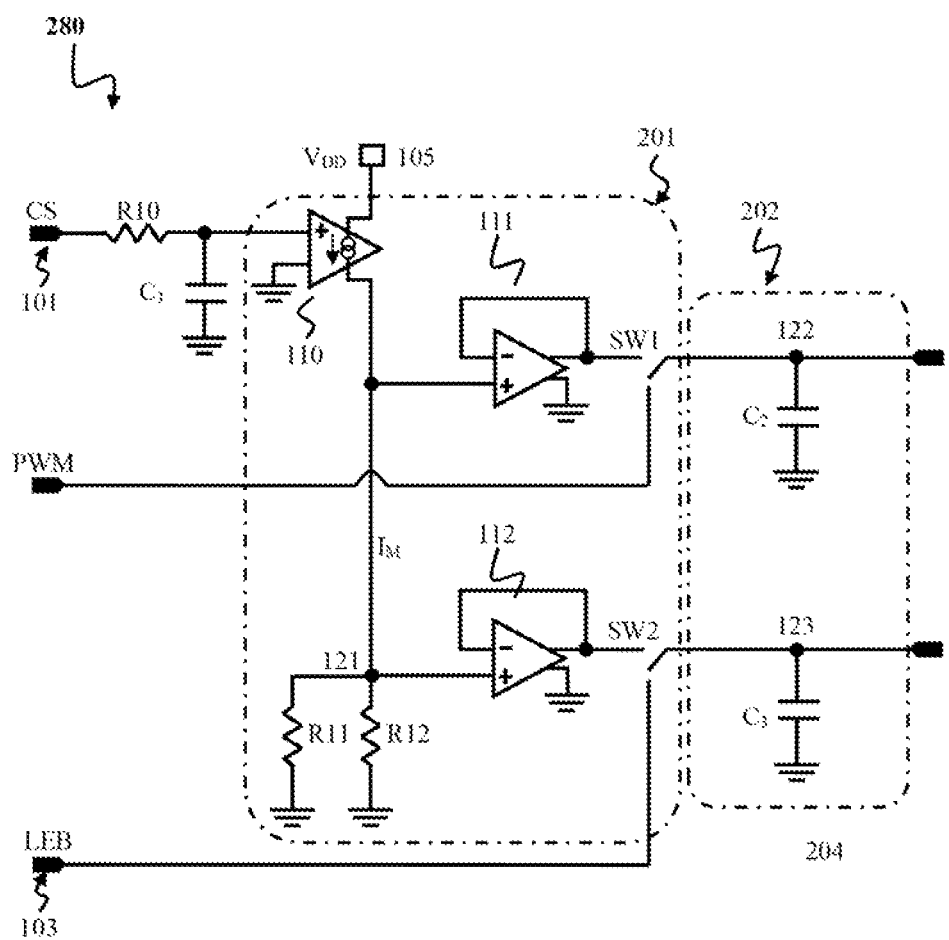
FIG. 13 shows circuit diagrams of the detection module and sample-and-hold latch of the calculation circuit in FIG. 7.

As shown in FIG. 13, in the detection module 201, a DC power supply voltage $V_{DD}$ is applied at a node 105 providing an operating voltage for the voltage-current converter 110 having an input end connected to a common node 101 of the sensing resistor $R_S$ connected to the source terminal of the main switch QM, which is mentioned above in FIG. 1. The voltage-current converter 110 is also referred as the first voltage-current converter. A conversion resistor R12 is connected between the output end of the voltage-current converter 110 and the ground, so that the voltage-current converter 110 will convert the sensing voltage $V_{CS}$ sent to its input terminal to an intermediate current that flows through the conversion resister R12 producing a voltage at a node 121 at the ungrounded end of the conversion resistor R12. As an option, a resistor R10 may be connected between the common node 101 and the input end of the voltage-current converter 110, and a capacitor C1 is connected between the input end of the voltage-current converter 110 and the ground, thus providing a relatively smooth sensing signal $V_{CS}$ transmitted to the input end of the voltage-current converter 110. As another option, an regulating resistor R11 with a variable resistance may be connected between the node 121 and the ground, where the regulating resistor R11 and the conversion resistor R12 of the detection module 201 are connected in parallel between the node 121 and the ground so that the total resistance between the node 121 and the ground becomes adjustable through the regulating resistor R1.

The detection module 201 also includes a first voltage follower 111 and a second voltage follower 112, where the positive input ends of the first voltage follower 111 and the second voltage follower 112 are connected with the node 121 at the ungrounded end of the conversion resistor R12, and the negative input end of the first voltage follower 111 is connected to its output end, while the negative input end of the second voltage follower 112 is connected to its output end. Each of the first voltage follower 111 and the second voltage follower 112 generates a voltage corresponding to the voltage applied at its positive input end. The first voltage follower 111 and the second voltage follower 112 are used as the input buffers that have a high input impedance for connecting with the signal source, since the high input impedance can isolate the level of interaction between input and output, and a low output impedance for reducing the capture time of the sensing signal $V_{CS}$. The first voltage follower 111 and the second voltage follower 112 are operational amplifiers configured as the voltage followers or unity-gain buffers. In addition, as mentioned above, the sensing signal $V_{CS}$ needs to be captured at the appropriate time. Therefore, the detection module 201 further includes a switch SW1 referred as a first switch and a switch SW2 referred as a second switch, where the switch SW1 is connected between the output end of the first voltage follower 111 and a sample-and-hold latch 202, and the switch SW2 is also connected between the output end of the second voltage follower 112 and the sample-and-hold latch 202. The switch SW1, the switch SW2 and others that will be described later are all three-terminal electronic switches, each of which includes an input terminal and an output terminal opposite the input terminal and a control terminal for controlling the on or off between the input terminal and the output terminal. The electronic switches can be P-type or N-type MOS transistors, bipolar transistors, junction transistors or a combination thereof.

In the CCM, the detection module 201 detects a sensing signal $V_{CS\text{-}LEB}$ at corresponding to the time $t_{12}$ in FIG. 4C at node 101 at one end of the sensing resistor $R_S$. In addition to shielding the initial spike 355 of the sensing signal $V_{CS}$, the leading edge blanking signal LEB also connects to the node 103 of the control terminal of the switch SW2, as such the switch SW2 is turned on when the leading edge blanking signal LEB has the logic high level and the change in the primary current $I_P$ is represented by the sensing signal $V_{CS}$ at the node 101. In any cycle, in the period $T_{LEB}$ from time $t_{11}$ when the main switch QM is turned on to the time $t_{12}$ when the leading edge blanking signal LEB changes from the high level to the low level, the primary current $I_P$ accordingly increases from the leading edge initial value $I_{PV}$ at time $t_{11}$ to the blanking current value $I_{LEB}$ at the time $t_{12}$, thus the change of the sensing signal $V_{CS}$ at the node 101 is detected by the detection module 201, then the voltage-current converter 110 will reconvert the current converted from the sensing signal $V_{CS}$ to a voltage applied at the node 121 at the ungrounded end of the conversion resistor R12. Specifically, although the dynamic sensing signal $V_{CS}$ is always transmitted to the voltage-current converter 110 in the time $T_{LEB}$, but when the leading edge blanking signal LEB changes from high level to low level to turn off the switch SW2, the second voltage follower 112 is unable to convert the voltage at node 121 into the current after the time $t_{12}$ and before the leading edge blanking signal LEB changes from low level to high level in the next cycle. At time $t_{12}$, the sensing signal $V_{CS\text{-}LEB}$ of the blanking current value $I_{LEB}$ is fed to the input end of the voltage-current converter 110 and is converted to an intermediate transient current $I_M$ flowing through the conversion resistor R12; hence the intermediate transient current $I_M$ is further converted into the voltage drop crossing the conversion resistor R12, which equals to the voltage sensing signal $V_{CS\text{-}LEB}$, while the second voltage follower 112 converts the voltage applied on the conversion resistor R12, i.e., the voltage applied at node 121, into a voltage that equals to the sensing signal $V_{CS\text{-}LEB}$ at its output end. After the leading edge blanking signal LEB changes from high level to low level, the final out voltage generated by the second voltage follower 112 in one cycle Ts is set to the level of the voltage sensing signal $V_{CS\text{-}LEB}$ corresponding to the time $t_{12}$. The final out voltage generated by the second voltage follower 112 is sent to a second storage capacitor $C_3$ of the sample-and-hold latch (S/H) 202 in the calculation circuit 280 to charge the second storage capacitor $C_3$, and the switch SW2 is connected between one end of the second storage capacitor $C_3$ at node 123 and the output end of the second voltage follower 112, while the other end of the second storage capacitor $C_3$ is grounded. The second storage capacitor $C_3$ is charged with the voltage equivalent to the voltage sensing signal $V_{CS\text{-}LEB}$, thus the second storage capacitor $C_3$ holds and stores the information of the blanking current value $I_{LEB}$ flowing through the primary winding 130A at time $t_{12}$, and the stored information represents the voltage value $V_{CS\text{-}LEB}$ applied at node 123 at one end of the second storage capacitor $C_3$.

Still in the CCM, the detection module 201 also detects a sensing signal $V_{CS\text{-}OFF}$ corresponding to the time $t_{13}$ in FIG. 4C at node 101 at one end of the sensing resistor $R_S$. The control signal, such as PWM, not only drives the control terminal of the main switch QM, but also drives the control terminal of the switch SW1, therefore the switch SW1 is always turned on when the control signal has the logic high level; otherwise, the switch SW1 is turned off. With gradually increasing of the primary current $I_P$, the value of the primary current $I_P$ is totally reflected by the sensing signal $V_{CS}$ at node 101. In any cycle, in the period from time $t_{11}$ when the main switch QM is turned on to time $t_{13}$ when the control signal changes from the high level to the low level, the primary current $I_P$ accordingly increases from the leading edge initial value $I_{PV}$ to the off current value $I_{OFF}$ at time $t_{13}$, thus the corresponding change of the sensing signal $V_{CS}$ is detected by the detection module 201 at node 101, and the voltage-current converter 110 reconverts the current value converted from the sensing signal $V_{CS}$ to a voltage value at node 121 at the ungrounded end of the conversion resistor R12. Specifically, although the dynamic sensing signal $V_{CS}$ is transmitted to the voltage-current converter 110 in the period from time $t_1$ to time $t_{13}$ in the CCM, and when the control signal changes from the high level to the low level to turn off the switch SW1, after the time $t_{13}$ and before the control signal changes from low level to the high level in the next cycle, the first voltage follower 111 cannot convert the voltage value at node 121 into the current. The sensing signal $V_{CS\text{-}LEB}$ corresponding to time $t_{13}$ representing the off current value $I_{OFF}$ is fed into the input end of the voltage-current converter 110 and is converted to the intermediate transient current $I_M$ flowing through the transfer resistor R12; then, the intermediate transient current $I_M$ is further converted into a voltage crossing the conversion resistor R12, which equals to the voltage sensing signal $V_{CS\text{-}OFF}$, while the first voltage follower 111 further converts the voltage applied on the conversion resistor R12, i.e., the voltage at the node 121, into a final output voltage that equals to the sensing signal $V_{CS\text{-}OFF}$ at its output. The final output voltage generated by the first voltage follower 111 in one cycle Ts is set to the level of the voltage sensing signal $V_{CS\text{-}OFF}$ corresponding to the time $t_{13}$. The output voltage generated from the output end of the first voltage follower 111 is transmitted to a first storage capacitor $C_2$ of the sample-and-hold latch 202, and the switch SW1 is connected between one end of the first storage capacitor $C_2$ at node 122 and the output end of the first voltage follower 111, while the other end of the first storage capacitor $C_2$ is grounded. The output voltage equivalent to the voltage sensing signal $V_{CS\text{-}OFF}$ charges the first storage capacitor $C_2$, thus the first storage capacitor $C_2$ holds and stores the information of the off current value $I_{OFF}$ flowing through the primary winding 130A corresponding to time $t_{13}$, and the stored information is considered as the voltage value $V_{CS\text{-}OFF}$ applied at node 122 at the ungrounded end of the first storage capacitor $C_2$.

The same method using the detection module 201 to capture the blanking current value $I_{LEB}$ at time $t_{12}$ and the off current value $I_{OFF}$ at time $t_{13}$ and store in the sample-and-hold latch 202 in the CCM is also applied to capture the blanking current value $I_{LEB}$ at time $t_{22}$ and the off current value $I_{OFF}$ at time $t_{23}$ and stores in the sample-and-hold latch 202 in the DCM.

In the DCM, the detection module 201 detects the sensing signal $V_{CS\text{-}LEB}$ corresponding to the time $t_{22}$ in FIG. 5C at the node 101 at one end of the sensing resistor $R_S$. The leading edge blanking signal LEB is applied to the node 103 at the control terminal of the switch SW2, and the switch SW2 is turned on when the leading edge blanking signal LEB is at the logic high level. In a cycle, in the period $T_{LEB}$ from the time $t_{21}$ when the main switch QM is turned on to the time $t_{22}$ when the leading edge blanking signal LEB changes from the high level to the low level, the primary current $I_P$ accordingly increases from the leading edge initial value $I_{PV}$ of zero at time $t_{21}$ to the blanking current value $I_{LEB}$ at time $t_{22}$. Although the dynamic sensing signal is always sent to the voltage-current converter 110 in the time $T_{LEB}$, and the leading edge blanking signal LEB changes from high level to low level to turn off the switch SW2 at time $t_{22}$, after the time $t_{22}$ and before the leading edge blanking signal LEB changes from low level to high level in the next cycle, the second voltage follower 112 cannot convert the voltage value at the node 121 into the current. Further, the sensing signal $V_{CS\text{-}LEB}$ corresponding to the time $t_{22}$ representing the blanking current value $I_{LEB}$ is sent to the input end of the voltage-current converter 110 and is converted to the intermediate transient current $I_M$ flowing through the conversion resistor R12; thus, the intermediate transient current $I_M$ is further converted into the voltage crossing the conversion resistor R12, while the second voltage follower 112 further converts the voltage applied on the conversion resistor R12, i.e., the voltage applied at node 121, into a voltage that equals to the sensing signal $V_{CS\text{-}LEB}$ at its output. The final output voltage generated by the second voltage follower 112 in one cycle Ts is set to the level of the voltage sensing signal $V_{CS\text{-}LEB}$ corresponding to the time $t_{22}$. The voltage generated from the second voltage follower 112 and equivalent to the sensing signal $V_{CS\text{-}LEB}$ is transmitted to the second storage capacitor $C_3$ to charge the second storage capacitor $C_3$, therefore the second storage capacitor $C_3$ holds and stores the information of the off current value $I_{LEB}$ flowing through the primary winding 130A corresponding to the time $t_{23}$, and the stored information is considered as the voltage value $V_{CS-LEB}$ applied at the node 123 at the ungrounded end of the second storage capacitor $C_3$.

Still in the DCM, the detection module 201 also detects the sensing signal $V_{CS-OFF}$ corresponding to the time $t_{23}$ in FIG. 5C at the node 101 at one end of the inductive resistor $R_S$. The control signal is sent to the control terminal of the switch SW1, and the switch SW1 is turned on when the control signal is at the logic high level. In a period from time $t_{21}$ when the main switch QM is turned on to time $t_{23}$ when the control signal LEB changes from the high level to the low level, the primary current $I_P$ accordingly increases from the leading edge initial value $I_{PV}$ of zero at time $t_{21}$ to the off current value $I_{OFF}$ at time $t_{23}$. Although the dynamic sensing signal $V_{CS}$ is always fed to the voltage-current converter 110 from the time $t_{21}$ to the time $t_{23}$, when the control signal changes from the high level to the low level to turn off the switch SW1, after the time $t_{23}$ and before the control signal changes from low level to the high level in the next cycle, the first voltage follower 111 is unable to convert the voltage value at node 121 to a current. Further, the sensing signal $V_{CS-OFF}$ corresponding to the time $t_{23}$ representing the off current value $I_{OFF}$ is sent to the input end of the voltage-current converter 110 and is converted to the intermediate transient current $I_M$ flowing through the transfer resistor R12; thus, the intermediate transient current $I_M$ is further converted into the voltage crossing the conversion resistor R12, while the first voltage follower 111 further converts the voltage applied on the conversion resistor R12, i.e., the voltage applied at the node 121, into a voltage that equals to the sensing signal $V_{CS-OFF}$ at its output. The final output voltage generated by the first voltage follower 111 in one cycle Ts is set to the level of the voltage sensing signal $V_{CS-OFF}$ corresponding to the time $t_{23}$. The final output voltage generated by the first voltage follower 111 and equivalent to the sensing signal $V_{CS-OFF}$ is transmitted to the first storage capacitor $C_2$ to charge the first storage capacitor $C_2$, therefore the first storage capacitor $C_2$ holds and stores the information of the off current value $I_{OFF}$ flowing through the primary winding 130A corresponding to the time $t_{23}$, and the stored information is considered as the voltage value $V_{CS-OFF}$ applied at the node 122 at the ungrounded end of the first storage capacitor $C_2$.

Referring to FIG. 7, the calculation circuit 280 further includes a current summing unit 203 that includes two voltage-current converters 113 and 114, which are accordingly referred as the second voltage-current converter and the third voltage-current converter. A DC power voltage $V_{DD}$ is applied to a node 106 and a node 107 providing operating voltage for the voltage-current converter 113 and the voltage-current converter 114, and a summing resistor R14 with a resistance of $R_{SUM}$ is connected between the output end of the voltage-current converter 113 and the ground. The input end of the voltage-current converter 113 is connected to the node 122 at one end of the first storage capacitor $C_2$ (shown in FIG. 13), and the information of off current value $I_{OFF}$ stored in the first storage capacitor $C_2$ is transmitted to the voltage-current converter 113 in a form of the voltage value $V_{CS-OFF}$, then the information of off current value $I_{OFF}$ is converted by the voltage-current converter 113 to a current that equals to the initial off current value $I_{OFF}$. The output ends of the voltage-current converter 113 and the voltage-current converter 114 are connected together at a common node 124 at the ungrounded end of the summing resistor R14, and the other end of the summing resistor R14 is grounded. The input end of the voltage-current converter 114 is connected to the node 123 at one end of the second storage capacitor $C_3$ (shown in FIG. 13), and the information of blanking current value $I_{LEB}$ stored in the second storage capacitor $C_3$ is transmitted to the voltage-current converter 114 in a form of the voltage $V_{CS-LEB}$, thus the information of blanking current value $I_{LEB}$ is converted by the voltage-current converter 114 to a current that equals to the initial blanking current value $I_{LEB}$. As such, the total current flowing through the summing resistor R14 is equal to the sum of the off current value $I_{OFF}$ and the blanking current value $I_{LEB}$, i.e., $I_{LEB}+I_{OFF}$. In addition, the current summing unit 203 further includes a third voltage follower 128 having the positive input end connected to the node 124 and the negative input end connected to its output end. The resistance $R_{SUM}$ of the summing resistor R14 is adjusted so that the output voltage $V_{TRS}$ of the third voltage follower 128 can be adjustable, $V_{TRS}=R_{SUM}\times(I_{LEB}+I_{OFF})$, where the preset current $I_{SUM}$ equals a factor of the sum $(I_{LEB}+I_{OFF})$, in other words, the preset current $I_{SUM}$ can be set to be equal to $K\times(I_{LEB}+I_{OFF})$. K is a positive constant, for example the preset current $I_{SUM}$ is equal to $0.5\times(I_{LEB}+I_{OFF})$. In addition, the voltage $V_{TRS}$ generated by the third voltage follower 128 is measurable, and the sum of the off current value $I_{OFF}$ and the blanking current value $I_{LEB}$ contained in the preset current $I_{SUM}$ can be equivalently converted from the voltage $V_{TRS}$.

Figure 8:
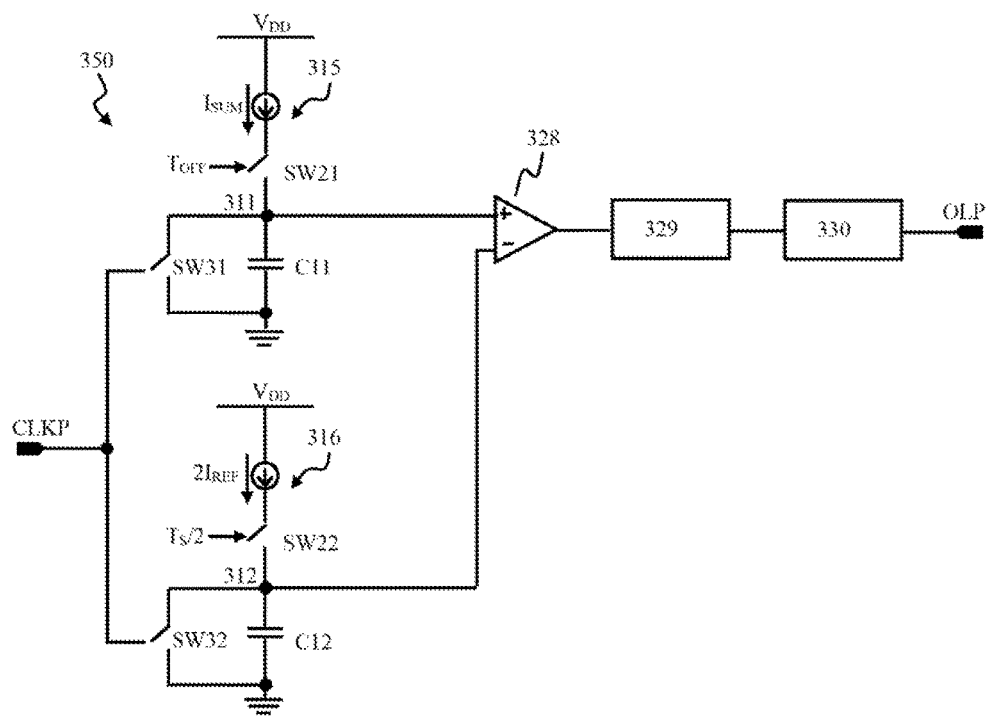
FIG. 8 shows an overload detection circuit of the prevent invention for calculating the average output current and deciding whether it is overload.

Referring to FIG. 8, in an overload detection circuit 350 for detecting the load condition, between the voltage source $V_{DD}$ and the ground, a first branch includes a current source 315 providing a current value $I_{SUM}$, a switch SW21 and a first capacitor C11 all connected in series, where one end of the switch SW21 is connected with the current source 315 while the other end is connected to a node 311 at one end of the first capacitor C11, and the other end of the first capacitor C11 is grounded. The current value $I_{SUM}$ provided by the current source 315 is controlled by the output of FIG. 7 and the circuit configuration is well known in the art therefore will not be described here. In addition, between the voltage source $V_{DD}$ and the grounded end, a second branch includes a current source 316 providing a reference current value $I_{REF}$, a switch SW22 and a second capacitor C12 all connected in series, where one end of the switch SW22 is connected with the current source 316 while the other end is connected to a node 316 at one end of the second capacitor C12, and the other end of the second capacitor C12 is grounded. The overload detection circuit 350 further comprises a comparator 328 having the positive input end connected to a common node 311 of the switch SW21 and the first capacitor C11 and the negative input end connected to a common node 312 of the switch SW22 and the second capacitor C12, and the comparator 328 is mainly used for comparing the voltage of the first capacitor C11 with that of the second capacitor C12.

Figure 9:
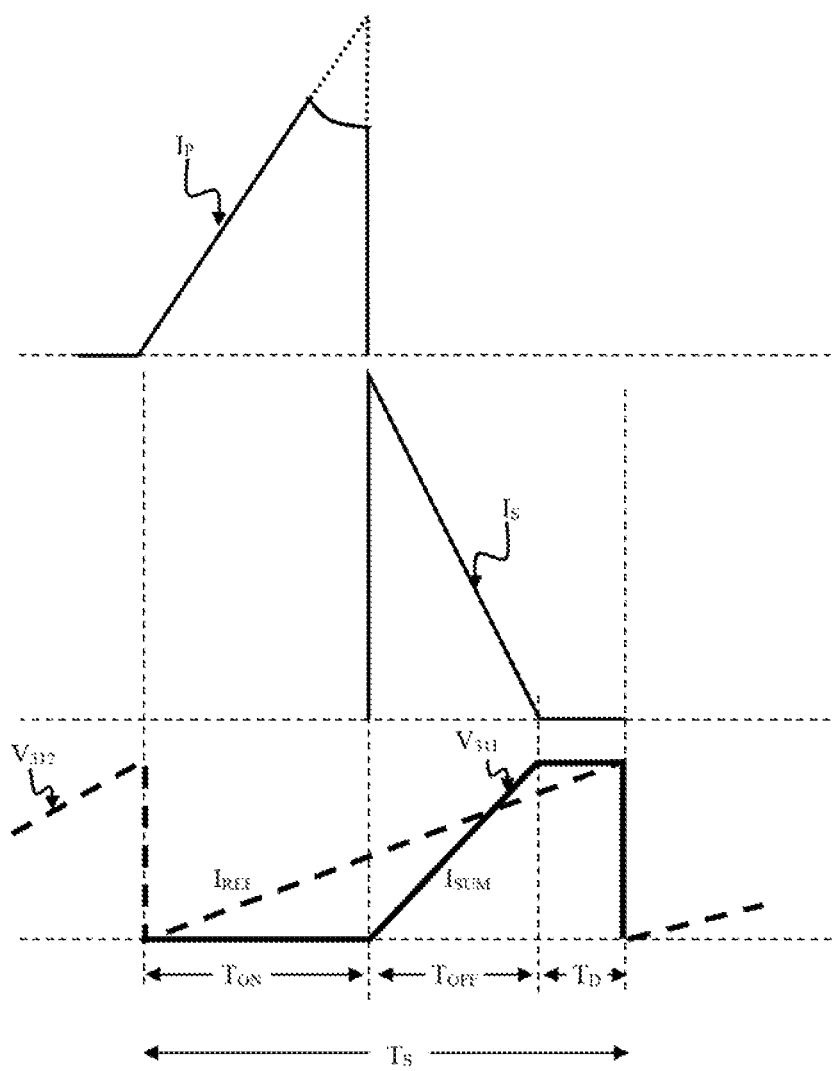
FIG. 9 shows a waveform of a second capacitor charged in the whole cycle.

As shown in FIG. 9, the first capacitor C11 in FIG. 8 is charged by the preset current $I_{SUM}$ provided by the current source 315, which can be either a single preset current $I_{SUM}$ or a multiple of the preset current $I_{SUM}$, and the second capacitor C12 in FIG. 8 is charged by the reference current $I_{REF}$ provided by the current source 316, which can be either a single reference current $I_{REF}$ or a multiple of the reference current $I_{REF}$. The overload output current also leads to the increase of the preset current $I_{SUM}$, so the load condition can be evaluated at the output end of the comparator 328. The time for charging the first capacitor C11 and the second capacitor C12 in each cycle is relatively flexible, if the second capacitor C12 is continuously charged in the whole cycle, as shown in FIG. 9, for example, in the DCM, the voltage $V_{312}$ (i.e., the voltage value at the node 312) of the second capacitor C12 and the voltage $V_{311}$ (i.e., the voltage value at the node 311) are crossed during the off-period $T_{OFF}$, when the capacitor is not charged completely, however the comparator 328 will display a comparison result. Furthermore, at the end of the cycle $T_S$, when the second capacitor C12 is charged completely, the comparison of the voltage $V_{312}$ and the voltage $V_{311}$ is stopped thus the comparator 328 generates the final comparison result. In an optional embodiment, the first capacitor C11 and the second capacitor C12 will instantaneously discharge the stored energy (not shown) at the end of one cycle and before charging in the next cycle. For example, in the overload detection circuit 350, a three-terminal electronic switch SW31 is connected in parallel to the first capacitor C11 and a three-terminal electronic switches SW32 is connected in parallel with the second capacitor C12, where the control ends of the switch SW31 and the switch SW32 synchronously receive a period clock signal (CLKP) that drives the switch SW31 and the switch SW32 to turn on at the time before the beginning of each cycle Ts or at the end of each cycle, as such the first capacitor C11 and the second capacitor C12 can be synchronously discharged when the switch SW31 connected between the node 311 and the ground and the switch SW32 connected between the node 312 and the ground are turned on. In an option, in each cycle, these electronic switches can be trigged by the control signal driving the main switch QM to discharge the capacitors C11 and C12 to the ground.

Figure 10:
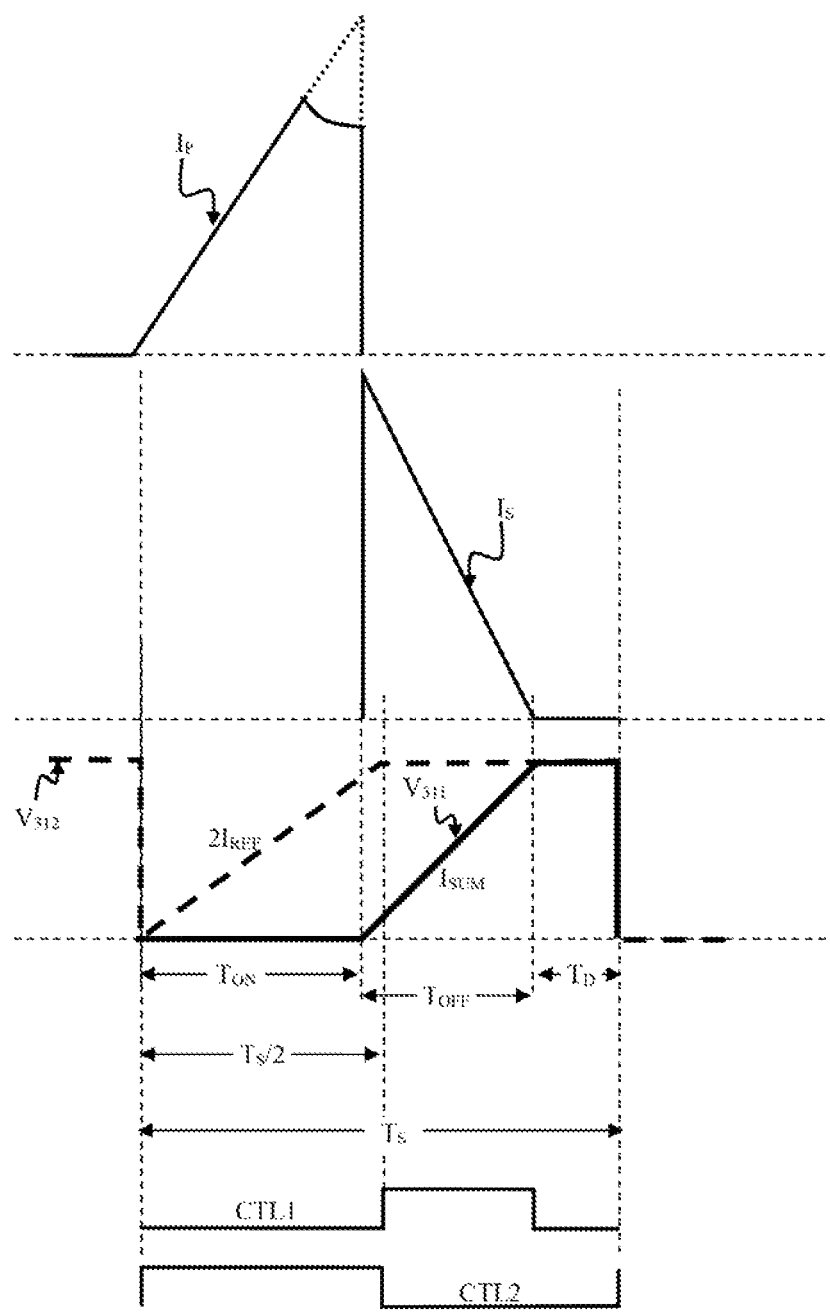
FIG. 10 shows a waveform of the second capacitor charged in a half of the cycle.

Referring to FIG. 10 according to a preferred embodiment of the prevent invention, the second capacitor C12 is not charged in the whole cycle $T_S$, and a driving signal CTL2 transmitted to the control terminal of the switch SW22 controlling the switch SW22 turning on in a half of a cycle Ts (i.e., Ts/2) and off in the other haft, therefore the second capacitor C12 is charged in the period from the beginning of each cycle Ts to the time $T_S/2$, and is not charged in the period between the time $T_S/2$ to the end of the cycle Ts. In order to calculate the product of the preset current $I_{SUM}$ multiplying with $T_{OFF}/T_S$, a control signal CTL1 transmitted to the control terminal of the switch SW21 to turn on in the off period $T_{OFF}$ of the cycle Ts and turn off at the other times, thus the first capacitor C11 is charged from the beginning of the off period $T_{OFF}$ and is completely charged at the end of the off period $T_{OFF}$. In the DCM, the first capacitor C11 is not charged in the on period $T_{ON}$ and the dwell time $T_D$. Similarly, in the CCM, the first capacitor C11 is only charged in the off period $T_{OFF}$ and is not charged in the on period $T_{ON}$. The waveform of the voltage $V_{311}$ at the node 311 and that of the voltage $V_{312}$ at the node 312 are shown in FIG. 10. In this embodiment, the charging time of the second capacitor C12 is shortened to a half of a cycle Ts (i.e., Ts/2), in order to keep the same final charge amount as in the whole cycle, the second capacitor C12 must be charged by a current of $2 \times I_{REF}$, so that the charge amount in the half of cycle is equal $(2 \times I_{REF}) \times (T_S/2)$ that is equal to the charge amount of $I_{REF} \times T_S$ in the whole cycle. Thus, the comparison result of the voltage $V_{311}$ and the voltage $V_{312}$ from the comparator 328 is not limited to the end time of one cycle, for example, the comparison result may also be made before the end of the off period $T_{OFF}$, without causing a misoperation.

For example in the DCM, the reference current $I_{REF}$ is kept constant and the actual preset current $I_{SUM}$ is gradually increased, at the end of the off period $T_{OFF}$, when the first capacitor C11 has been charged for a period time of $T_{OFF}$, the comparator 328 starts generating the first high level result taken as a critical condition in which the voltage $V_{311}$ is exactly equal to the voltage $V_{312}$, in other words, the charge amount of $I_{REF} \times T_S$ of the second capacitor C12 at the end of time $T_S/2$ is equal to the charge amount of the first capacitor C11 at the end of the off time $T_{OFF}$. This critical condition is also appropriate to the CCM, but only a difference from the DCM is that the dwell time is not needed to be considered. Under such condition, a rated current value $I_{SUM1}$ of the preset current at the time is set to meet the following function relationship:

$$\frac{T_{OFF} \times I_{SUM1}}{C_{11}} = \frac{\frac{T_S}{2} \times (2 \times I_{REF})}{C_{12}} \quad (13)$$

$$I_{SUM1} = \frac{T_S}{T_{OFF}} \times I_{REF} \times \frac{C_{11}}{C_{12}} \quad (14)$$

If the capacitances of the first capacitor C11 and the second capacitor C12 are the same, the rated current value $I_{SUM1}$ equals to $(I_{REF} \times T_S) \div T_{OFF}$. The $I_{SUM1}$ is a critical value, and when the actual preset current $I_{SUM}$ is greater than $I_{SUM1}$, or the actual output current $I_O$ is greater than $(N \times I_{REF} \times C_{11}) \div C_{12}$, for example, the load in the DCM of FIG. 11, before the end of each off period $T_{OFF}$, i.e., before the falling edge of the driving signal CTL1, the comparator 328 will start outputting the high level until the end of the cycle when the voltage $V_{311}$ is greater than the voltage $V_{312}$. The output end of the comparator 328 is connected to the input end of one monostable multivibrator 329, as shown in FIG. 8, thus the rising edge of the comparison result will trigger the monostable multivibrator 329 to send a high level signal before the end of the off period $T_{OFF}$ of each cycle. The output end of the monostable multivibrator 329 is connected to a counter 330 used for receiving an OC (over current) signal sent by the monostable multivibrator 329 at its CLK end, if the counter 330 receive the OC signal of the high level in several consecutive cycles with the total time length exceeding one preset time, the counter 330 detects that the converter accesses into the overloading condition, and thus send an overload protection signal OLP to turn off the whole power device.

Figure 11:
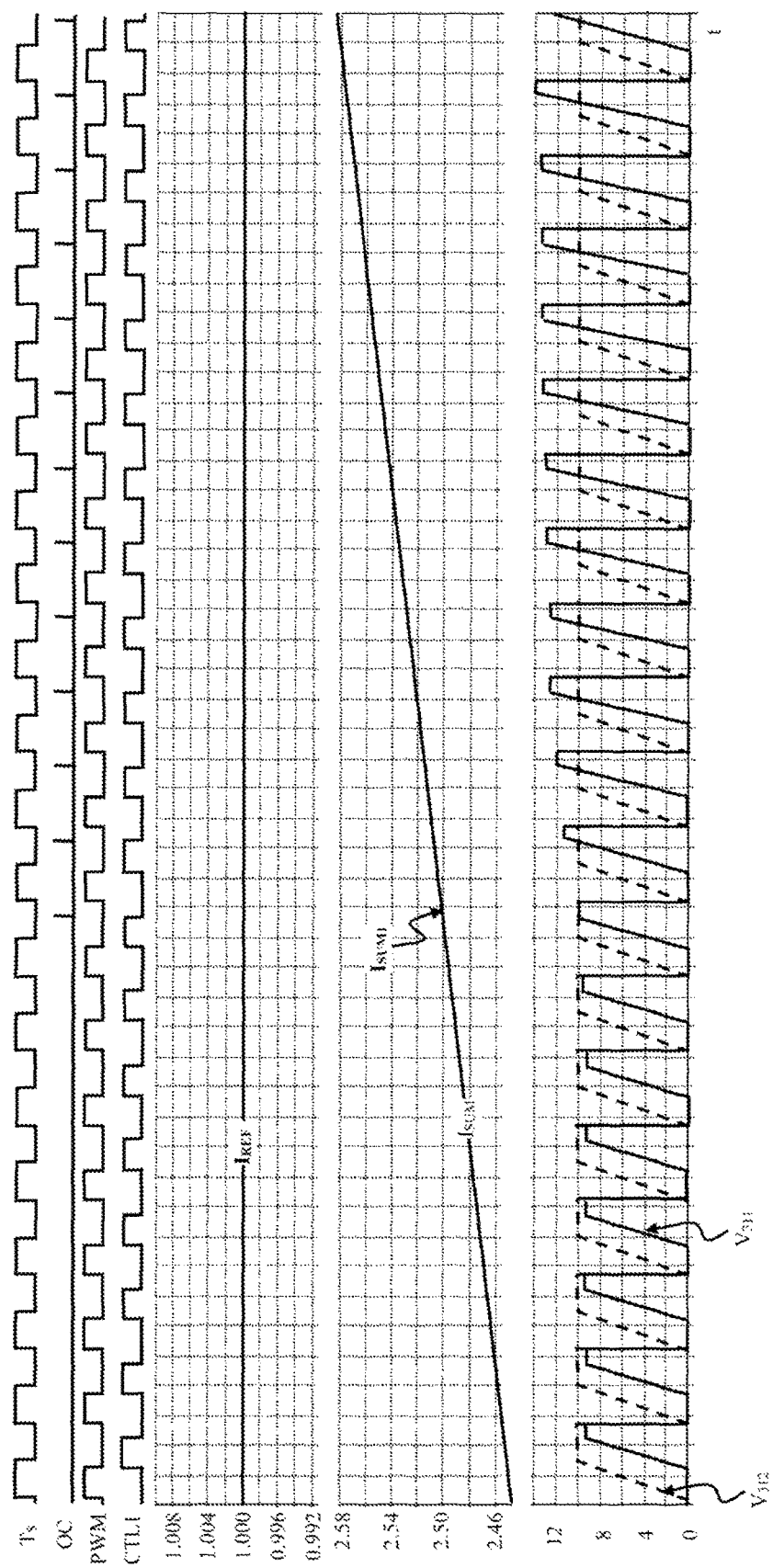
FIG. 11 shows the change in output results of a monostable multivibrator from the light load to the heavy load in a DCM.
Figure 12:
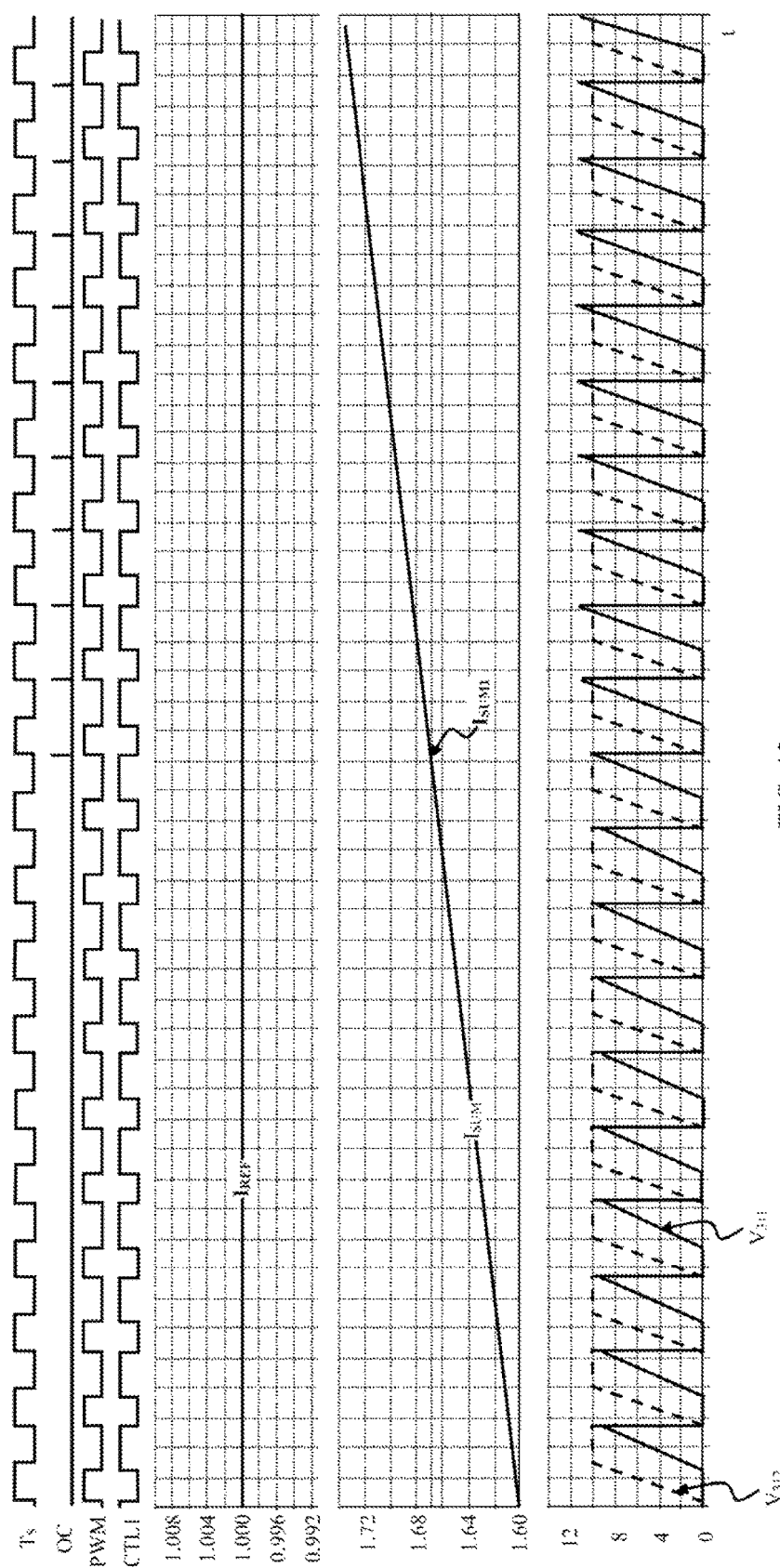
FIG. 12 shows the change in the output results of the monostable multivibrator from the light load to the heavy load in a CCM.

On the contrary, the voltage $V_{311}$ will not exceed the voltage $V_{312}$ when the actual preset current $I_{SUM}$ is less than the rated value $I_{SUM}$, or the actual output current $I_O$ is less than $(N \times I_{REF} \times C_{11}) \div C_{12}$, for example, the load is in the light load condition in the DCM as shown in FIG. 11. Under such situation, the comparator 328 will not generate the high level result, nor trigger the monostable multivibrator 329 to send the logic high level signal, thus the counter 330 will not send the overload protection signal OLP. Similarly, the rated current value $I_{SUM1}$ is also set in the CCM, but the difference from the DCM is that the cycle $T_S$ of the DCM also contains the dwell time $T_D$. As the actual preset current $I_{SUM}$ is greater than the $I_{SUM1}$, or the output current $I_O$ is greater than $(N \times I_{REF} \times C_{11}) \div C_{12}$, for example, the load is heavy as shown in FIG. 12, the off period $T_{OFF}$ is ended earlier, and the comparator 328 start generating the high level signal until the end of the cycle as the voltage $V_{311}$ is greater than the voltage $V_{312}$, thus the OC signal sent by the monostable multivibrator 329 is triggered to have high level before the off period $T_{OFF}$ of each cycle is ended. As mentioned above, the output end of the monostable multivibrator 329 is connected to the counter 330 used for receiving the over current signal OC at its CLK end, and if the counter 330 receives the high level signal OC in several consecutive cycles with the total time exceeding one preset time, the counter 330 send an overload protection signal OLP to turn off the whole power device. Conversely, in the CCM mode, the voltage $V_{311}$ will not exceed the voltage $V_{312}$ as the actual preset current $I_{SUM}$ is less than the rated value $I_{SUM1}$, or the actual output current $I_O$ is less than $(N \times I_{REF} \times C_{11}) \div C_{12}$, for example the load is in the light load condition in the in FIG. 12. Therefore, under such situation, the comparator 328 in each cycle will not generate the high level signal, nor trigger the monostable multivibrator 329 to send the logic high level signal, so the counter 330 will not send the overload protection signal OLP.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The invention claimed is:

1. A circuit for evaluating a load condition in a flyback converter comprises:
   a detection module detecting a primary current flowing through a sensing resistor connecting in series with a primary winding, wherein the detection module captures an off current value $I_{OFF}$ flowing through the sensing resistor when a main switch driven by a control signal for controlling on or off of the primary winding is turned off, and a blanking current value $I_{LEB}$ flowing through the sensing resistor when an active state of a leading edge blanking signal for shielding an initial spike of the primary current ends;
   a first current source providing a preset current $I_{SUM}$ related to a sum of the off current value $I_{OFF}$ and the blanking current value $I_{LEB}$;
   a second current source providing a reference current;
   a first capacitor having a capacitance $C_{11}$ charged by the first current source and a second capacitor having a capacitance $C_{12}$ charged by the second current source; and
   a comparator having a positive input end receiving a voltage of the first capacitor and a negative input end receiving a voltage of the second capacitor,
   wherein a comparison result generated by the comparator provides the load condition when the preset current $I_{SUM}$ varies due to an output current transmitted to the load by the flyback converter varies.

2. The circuit for evaluating the load condition in the flyback converter of claim 1, wherein the preset current $I_{SUM}$ equals to a half of the sum of the off current value $I_{OFF}$ and the blanking current value $I_{LEB}$.

3. The circuit for evaluating the load condition in the flyback converter of claim 1 further comprises a first switch connected between the first current source and the first capacitor, wherein the switch is turned on during an off period $T_{OFF}$ in each switching cycle Ts of the main switch, and is turned off in the remaining time of each said switching cycle.

4. The circuit for evaluating the load condition in the flyback converter of claim 3, wherein the flyback converter is in an overload condition when the preset current $I_{SUM}$ exceeds a rated current value $I_{SUM1}$ that meets the following function relationship:

$$I_{SUM1} = \frac{T_S}{T_{OFF}} \times I_{REF} \times \frac{C_{11}}{C_{12}}$$

where $I_{REF}$ is the reference current provided by the second current source.

5. The circuit for evaluating the load condition in the flyback converter of claim 4, wherein when the preset current $I_{SUM}$ exceeds the rated current value $I_{SUM1}$, the comparison result of the comparator changes from a low level to a high level in the off period $T_{OFF}$ of the main switch in each cycle $T_S$, or
   when the preset current $I_{SUM}$ is lower than the rated current value $I_{SUM1}$, the comparison result of the comparator in each cycle Ts remains at the low level.

6. The circuit for evaluating the load condition in the flyback converter of claim 5 further comprises a monostable multivibrator receiving the comparison result from the comparator and a counter connecting with the monostable multivibrator, wherein the monostable multivibrator is trigged to generate a high level signal sent to the counter when a rising edge of the comparison result changes from the low level to the high level, and the counter generates an overloading protection signal representing the load changing into a heavy load condition when the counter receives the high level signal generated by the monostable multivibrator in a plurality of continuous cycles.

7. The circuit for evaluating the load condition in the flyback converter of claim 3 further comprises a second switch connected between the second current source and the second capacitor, wherein the second switch is turned on at a moment the main switch starts to turn on in each cycle and is turned off at a half of each cycle; wherein
   the second current source provides the reference current $2 \times I_{REF}$, such that the voltage of the second capacitor charged by the second current source at half of a cycle time $T_S$ equals:

$$\frac{\frac{T_S}{2} \times (2 \times I_{REF})}{C_{12}} = \frac{T_S \times I_{REF}}{C_{12}}.$$

8. The circuit for evaluating the load condition in the flyback converter of claim 7, wherein the capacitance $C_{11}$ of the first capacitor equals to the capacitance $C_{12}$ of the second capacitor.

9. The circuit for evaluating the load condition in the flyback converter of claim 1 further comprising a third switch connecting in parallel with the first capacitor and a fourth switch connecting in parallel with the second capacitor, wherein the third switch and the fourth switch are turned on at an end of each cycle to synchronously discharge the first capacitor and the second capacitor.

10. The circuit for evaluating the load condition in the flyback converter of claim 1 further comprises a sample-and-hold latch, wherein the detection module comprises a first voltage-current converter receiving a voltage sensing signal representing the primary current flowing through the sensing resistor and converting the voltage sensing signal representing the primary current into an intermediate current flowing through a conversion resistor connecting between an output end of the first voltage-current converter and ground;

the detection module converts an voltage applied on the conversion resistor into a voltage sensing signal corresponding to the off current value $I_{OFF}$ transmitting to the sample-and-hold latch for storage at a moment the main switch is turned off; and the detection module converts the voltage applied on the conversion resistor into a voltage sensing signal corresponding to the blanking current value $I_{LEB}$ transmitting to the sample-and-hold latch for storage at a moment the active state of the leading edge blanking signal ends.

11. The circuit for evaluating the load condition in the flyback converter of claim 10, wherein the detection module comprises a first voltage follower having a positive input end connected with the output end of the first voltage-current converter; and a fifth switch driven by the control signal is connected between an output end of the first voltage follower and one end of a first storage capacitor of the sample-and-hold latch, wherein the fifth switch is turned off synchronously at a moment the control signal changes from a second state to turn off the main switch, and the first voltage follower converts a voltage produced from the intermediate current flowing through the conversion resistor into the voltage sensing signal corresponding to the off current value $I_{OFF}$, and stored in the first storage capacitor.

12. The circuit for evaluating the load condition in the flyback converter of claim 10, wherein the detection module comprises a second voltage follower having a positive input end connected with the output end of the first voltage-current converter; and a sixth switch driven by a leading edge blanking signal is connected between an output end of the second voltage follower and one end of a second storage capacitor of the sample-and-hold latch, the sixth switch is turned off synchronously at a moment the leading edge blanking signal changes from a first state to a second state, wherein the second voltage follower converts a voltage produced from the intermediate current flowing through the conversion resistor into the voltage sensing signal corresponding to the blanking current value $I_{LEB}$ and stored in the second storage capacitor.

13. The circuit for evaluating the load condition in the flyback converter of claim 10 further comprises a current summing unit, wherein the current summing unit comprises:

a second voltage-current converter for restoring and converting the voltage sensing signal corresponding to the off current value $I_{OFF}$ stored in the sample-and-hold latch into a current equal to the off current value $I_{OFF}$ at an output end of the second voltage-current converter;

a third voltage-current converter for restoring and converting the voltage sensing signal corresponding to the blanking current value $I_{LEB}$ stored in the sample-and-hold latch into a current equal to the blanking current value $I_{LEB}$ at an output end of the third voltage-current converter;

the current generated by the second voltage-current converter and the current generated by third voltage-current converter are converged to a common node and are transmitted to a summing resistor between the common node and ground; and a third voltage follower having a positive input end connected to the common node for generating a voltage $V_{TRS}$ equal to $(I_{LEB}+I_{OFF})$ multiplying with a resistance value $R_{SUM}$ of the summing resistor, wherein the preset current $I_{SUM}$ related to the sum of the off current value $I_{OFF}$ and the blanking current value $I_{LEB}$ is captured.

14. A circuit for evaluating a load condition in a flyback converter comprises:

a first current source providing a preset current $I_{SUM}$ related to a sum of an off current value $I_{OFF}$ and a blanking current value $I_{LEB}$, wherein the off current value $I_{OFF}$ is a primary current flowing through a sensing resistor connecting in series with a primary winding when a main switch driven by a control signal for controlling on or off of the primary winding is turned off, and the blanking current value $I_{LEB}$ is the primary current flowing through the sensing resistor when an active state of a leading edge blanking signal for shielding an initial spike of the primary current ends;

a second current source providing a reference current;

a first capacitor having a capacitance $C_{11}$ charged by the first current source and a second capacitor having a capacitance $C_{12}$ charged by the second current source; and a comparator having a positive input end receiving a voltage of the first capacitor and a negative input end receiving a voltage of the second capacitor, wherein a comparison result generated by the comparator provides the load condition when the preset current $I_{SUM}$ varies due to an output current transmitted to the load by the flyback converter varies.

15. The circuit for evaluating the load condition in the flyback converter of claim 14, wherein the preset current $I_{SUM}$ equals to a half of the sum of the off current value $I_{OFF}$ and the blanking current value $I_{LEB}$.

16. The circuit for evaluating the load condition in the flyback converter of claim 14 further comprises a first switch connected between the first current source and the first capacitor, wherein the switch is turned on during an off period $T_{OFF}$ in each switching cycle Ts of the main switch, and is turned off in the remaining time of each said switching cycle.

17. The circuit for evaluating the load condition in the flyback converter of claim 16, wherein the flyback converter is in an overload condition when the preset current $I_{SUM}$ exceeds a rated current value $I_{SUM1}$ that meets the following function relationship:

$$I_{SUM1} = \frac{T_S}{T_{OFF}} \times I_{REF} \times \frac{C_{11}}{C_{12}}$$

where $I_{REF}$ is the reference current provided by the second current source.

18. The circuit for evaluating the load condition in the flyback converter of claim 17, wherein when the preset current $I_{SUM}$ exceeds the rated current value $I_{SUM1}$, the comparison result of the comparator changes from a low level to a high level in the off period $T_{OFF}$ of the main switch in each cycle $T_S$, or when the preset current $I_{SUM}$ is lower than the rated current value $I_{SUM1}$, the comparison result of the comparator in each cycle Ts remains at the low level.

19. The circuit for evaluating the load condition in the flyback converter of claim 18 further comprises a monostable multivibrator receiving the comparison result from the comparator and a counter connecting with the monostable multivibrator, wherein the monostable multivibrator is trigged to generate a high level signal sent to the counter when a rising edge of the comparison result changes from the low level to the high level, and the counter generates an overloading protection signal representing the load changing into a heavy load condition when the counter receives the high level signal generated by the monostable multivibrator in a plurality of continuous cycles.

20. The circuit for evaluating the load condition in the flyback converter of claim 16 further comprises a second switch connected between the second current source and the second capacitor, wherein the second switch is turned on at a moment the main switch starts to turn on in each cycle and is turned off at a half of each cycle; wherein the second current source provides the reference current $2 \times I_{REF}$, such that the voltage of the second capacitor charged by the second current source at half of a cycle time $T_S$ equals:

$$\frac{\frac{T_S}{2} \times (2 \times I_{REF})}{C_{12}} = \frac{T_S \times I_{REF}}{C_{12}}.$$

21. The circuit for evaluating the load condition in the flyback converter of claim 20, wherein the capacitance $C_{11}$ of the first capacitor equals to the capacitance $C_{12}$ of the second capacitor.

22. The circuit for evaluating the load condition in the flyback converter of claim 14 further comprising a third switch connecting in parallel with the first capacitor and a fourth switch connecting in parallel with the second capacitor, wherein the third switch and the fourth switch are turned on at an end of each cycle to synchronously discharge the first capacitor and the second capacitor.

* * * * *